(12) United States Patent
Bogaart

(10) Patent No.: US 9,983,485 B2
(45) Date of Patent: May 29, 2018

(54) LITHOGRAPHIC APPARATUS, DEVICE MANUFACTURING METHOD AND ASSOCIATED DATA PROCESSING APPARATUS AND COMPUTER PROGRAM PRODUCT

(71) Applicant: ASML Netherlands B.V., Veldhoven (NL)

(72) Inventor: Erik Willem Bogaart, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days. days.

(21) Appl. No.: 15/325,048

(22) PCT Filed: Jun. 9, 2015

(86) PCT No.: PCT/EP2015/062846
§ 371 (c)(1),
(2) Date: Jan. 9, 2017

(87) PCT Pub. No.: WO2016/008647
PCT Pub. Date: Jan. 21, 2016

(65) Prior Publication Data
US 2017/0184980 A1    Jun. 29, 2017

(30) Foreign Application Priority Data

Jul. 16, 2014  (EP) ..................................... 14177232
Dec. 22, 2014  (EP) ..................................... 14199539

(51) Int. Cl.
*G03B 27/42* (2006.01)
*G03F 7/20* (2006.01)
*G03F 9/00* (2006.01)

(52) U.S. Cl.
CPC ...... *G03F 7/70525* (2013.01); *G03F 7/70508* (2013.01); *G03F 7/70633* (2013.01);
(Continued)

(58) Field of Classification Search
CPC ............... G03F 7/70633; G03F 9/7088; G03F 7/70625; G03F 7/70641; G03F 7/0002;
(Continued)

(56) References Cited

U.S. PATENT DOCUMENTS 6,628,390 B1    9/2003  Johnson
8,976,355 B2    3/2015  Van Der Sanden et al.
(Continued)

FOREIGN PATENT DOCUMENTS

JP    2011-023725    2/2011
JP    2013-074294    4/2013
(Continued)

OTHER PUBLICATIONS

International Search Report and Written Opinion dated Nov. 10, 2015 in corresponding International Patent Application No. PCT/EP2015/062846.
(Continued)

*Primary Examiner* — Mesfin Asfaw
(74) *Attorney, Agent, or Firm* — Pillsbury Winthrop Shaw Pittman LLP

(57) ABSTRACT

A lithographic apparatus includes a number of sensors for measuring positions of features on a substrate prior to applying a pattern. Each sensor includes an imaging optical system. Position measurements are extracted from pixel data supplied by an image detector in each sensor. The imaging optical system includes one or more light field modulating elements and the processor processes the pixel data as a light-field image to extract the position measurements. The data processor may derive from each light-field image a focused image of a feature on the substrate, measuring positions of several features simultaneously, even though the substrate is not at the same level below all the sensors. The processor can also include corrections to reduce depth
(Continued)

dependency of an apparent position of the feature include a viewpoint correction. The data processor can also derive measurements of heights of features on the substrate.

20 Claims, 7 Drawing Sheets

(52) U.S. Cl.
CPC .......... *G03F 9/7026* (2013.01); *G03F 9/7034* (2013.01); *G03F 9/7088* (2013.01)

(58) Field of Classification Search
CPC .. G03F 7/70683; G03F 7/705; G03F 7/70725; G03F 7/70775; G03F 7/7085; G03F 9/7026; G03F 9/7069; G03F 7/70616; G03F 9/7034; G03F 9/7042; G03F 9/7084; G03F 9/7046
See application file for complete search history.

(56) References Cited

U.S. PATENT DOCUMENTS

| | | |
|---|---|---|
| 2008/0043212 A1 | 2/2008 | Shibazaki |
| 2008/0266655 A1 | 10/2008 | Levoy et al. |
| 2011/0013165 A1 | 1/2011 | Kaneko et al. |
| 2013/0230797 A1 | 9/2013 | Van Der Sanden et al. |

FOREIGN PATENT DOCUMENTS

| | | |
|---|---|---|
| WO | 2007/044725 | 4/2007 |
| WO | 2007/097466 | 7/2009 |

OTHER PUBLICATIONS

Marc Levoy et al., "Light Field Microscopy", ACM Transactions on Graphics, vol. 25, No. 3, Proc. SIGGRAPH, pp. 1-11 (2006).
Kshitij. Marwah et al., "Compressive Light Field Photography using Overcomplete Dictionaries and Optimized Projections", ACM Transactions on Graphics, vol. 32, No. 4, Proc. of SIGGRAPH, pp. 1-12 (2013).
Amit Ashok et al., "Compressive light-field imaging", SPIE Newsroom, DOI: 10.11117/2.1201008.003113, pp. 1-4 (Aug. 19, 2010).
Ivo Ihrke et al., "A Theory of Plenoptic Multiplexing", 2010 IEEE Computer Society Conference on Computer Vision and Pattern Recognition, pp. 1-8 (Jun. 13-18, 2010).
Zhimin Xu et al., "High-resolution lightfield photography using two masks", Optics Express, vol. 20, No. 10, pp. 1-13 (May 7, 2012).
Michael W. Tao et al., "Depth from Combining Defocus and Correspondence Using Light-Field Cameras," Proceedings of International Conference on Computer Vision (ICCV), pp. 673-680 (2013).
Tom E. Bishop et al., "Light Field Superresolution," IEEE International Conference on Computational Photography (ICCP), pp. 1-9 (Apr. 2009).
Oliver Cossairt et al., "When Does Computational Imaging Improve Performance?" IEEE Transactions on Image Processing, vol. 22, No. 2, pp. 1-12 (Aug. 31, 2012).
Japanese Office Action dated Feb. 20, 2018 in corresponding Japanese Patent Application No. 2016-575374.

(a) (b)

LITHOGRAPHIC APPARATUS, DEVICE MANUFACTURING METHOD AND ASSOCIATED DATA PROCESSING APPARATUS AND COMPUTER PROGRAM PRODUCT

CROSS-REFERENCE TO RELATED APPLICATIONS

This application is the U.S. national phase entry of PCT patent application no. PCT/EP2015/062846, which was filed on Jun. 9, 2015, which claims the benefit of priority of European patent application no. 14177232.7, which was filed on Jul. 16, 2014 and European patent application no. 14199539.9, which was filed on Dec. 22, 2014 and which are incorporated herein in their entirety by reference.

BACKGROUND

Field of the Invention

The present invention relates to a lithographic apparatus. The present invention further relates to methods of manufacturing devices using lithographic apparatus calibrated by such a method, and to data processing apparatuses and computer program products for implementing parts of such a method.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

A key requirement of the lithographic process is to be able to position a pattern in the correct position relative to features formed in previous layers on the substrate. Alignment sensors are provided for this purpose. As device structures become ever smaller, alignment specifications become ever tighter. Similarly, at least in the case of optical lithography where the patterns are applied using an optical projection system, a key requirement is to measure accurately the local height of the substrate, so that the pattern can be optically focused onto the resist layer.

Known forms of alignment sensing arrangements are disclosed in published patent applications such as US2008/043212A1 (Shibazaki) and US 2011/013165A1 (Kaneko), both of which are incorporated herein by reference. To reduce the time taken for measuring many positions across the substrate, these known examples provide multiple alignment sensors, operable in parallel. To obtain a highly accurate position measurement, each alignment sensor should be focused on the substrate surface (or on a target mark beneath the substrate surface). However, since the substrate is generally not perfectly flat, it is impossible for all of the alignment sensors to capture focused images of several marks at the same time. In the published applications, the alignment sensors are operated to capture multiple images of the same marks, each time with a different height (focus) setting. The best measurement of each mark is selected from the image where the corresponding sensor was in best focus. While the known system can provide accurate position measurements, the time taken for the multiple measurements can cause a reduction in throughput of substrates in the manufacturing process.

SUMMARY OF THE INVENTION

It is an object of the invention to enable the provision of an alignment sensing arrangement that can make position measurements on a plurality of marks in a single pass.

According to an aspect of the invention, there is provided a lithographic apparatus for applying a pattern onto a substrate, the apparatus including:

at least one sensor for measuring positions of features on the substrate prior to applying said pattern, said sensor comprising an imaging optical system and an image detector for capturing an image formed by said imaging optical system;

a data processor for extracting position measurements from pixel data supplied by said image detector; and a controller arranged to control the lithographic apparatus to apply said pattern to the substrate using the positions measured by said sensor, wherein said imaging optical system includes one or more light field modulating elements and said data processor is arranged to process said pixel data as a light-field image to extract said position measurements.

In some embodiments the position measurements are used for alignment. The data processor may be arranged for example to derive from said light-field image a focused image of a feature on the substrate, and to indicate a position of the feature based on said focused image in directions transverse to an optical axis of said imaging optical system. The data processor may be arranged to include in said position measurement a correction to reduce a depth dependency of an apparent position of the feature in the detected image. The data processor may be arranged to derive from said light-field image an image of a feature on the substrate with a viewpoint corrected.

In some embodiments the position measurement is used for focus control. For example said data processor may be arranged to derive from said light-field image a measurement of height of a feature on the substrate, the dimension of height being substantially parallel to an optical axis of the imaging optical system, the controller using said measurement of height to control focusing of a pattern applied by said lithographic apparatus.

According to an aspect of the invention, there is provided a device manufacturing method comprising applying patterns in successive layers on a substrate, and processing the substrate to produce functional device features, wherein the step of applying a pattern in at least one of said layers comprises:

(a) measuring positions of features on the substrate in a lithographic apparatus, using at least one light-field imaging sensor;

(b) extracting position measurements from light-field image data obtained using the sensor; and (c) controlling the lithographic apparatus to apply said pattern to the substrate using the positions measured by said alignment sensor.

The invention further provides a data processing system comprising one or more processors programmed to implement the data processor of a lithographic apparatus according to the invention as set forth above.

The invention further provides a computer program product comprising machine-readable instructions for causing one or more processors to perform the step (b) of a method according to the invention as set forth above.

BRIEF DESCRIPTION OF THE DRAWINGS

Embodiments of the invention will now be described, by way of example only, with reference to the accompanying drawings in which.

DETAILED DESCRIPTION OF EXEMPLARY EMBODIMENTS

Figure 1:
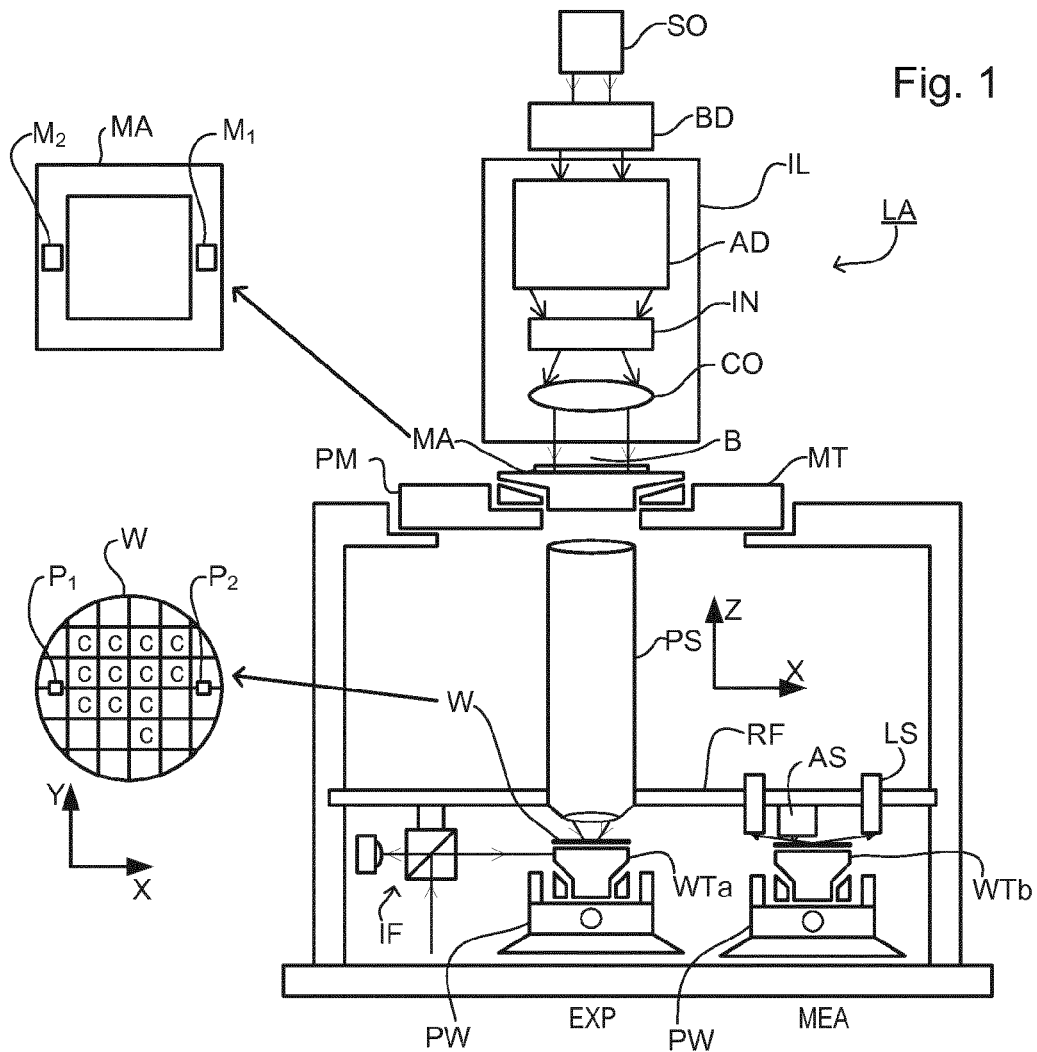
FIG. 1 depicts a lithographic apparatus according to an embodiment of the invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography An example of a programmable mirror array employs a matrix arrangement of small mirrors, each of which can be individually tilted so as to reflect an incoming radiation beam in different directions The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The velocity and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the length (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned. Each target portion is commonly referred to as a "field", and contains one or more product dies in the finished product.

Combinations and/or variations on the above described modes of use or entirely different modes of use may also be employed.

Lithographic apparatus LA in this example is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS.

Figure 2:
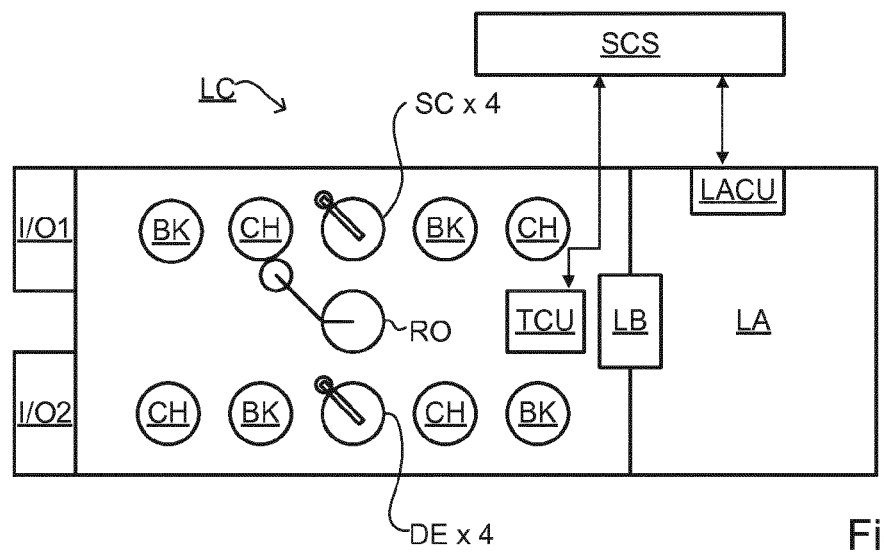
FIG. 2 depicts a lithographic cell or cluster incorporating the apparatus of FIG. 1.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency. The substrates processed by the track are then transferred to other processing tools for etching and other chemical or physical treatments within the device manufacturing process.

The lithographic apparatus control unit LACU controls all the movements and measurements of the various actuators and sensors described. LACU also includes signal processing and data processing capacity to implement desired calculations relevant to the operation of the apparatus. In the terminology of the introduction and claims, the combination of these processing and control functions referred to simply as the "controller". In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be done by a central processing unit, communicating with these sub-systems processing units, with operators and with other apparatuses involved in the lithographic manufacturing process.

The lithographic apparatus of FIG. 1 includes novel sensing arrangement to implement the alignment sensor AS. This will be described below, after some further background.

Figure 3:
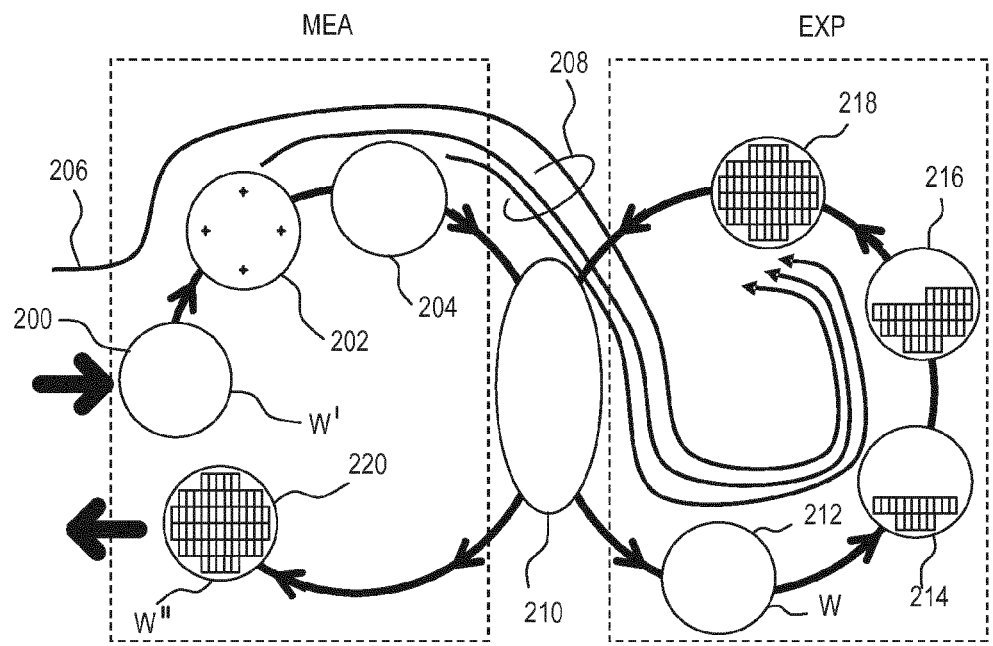
FIG. 3 illustrates schematically a measurement process and an exposure process in the apparatus of FIG. 1, according to known practice and modified in accordance with an embodiment of the present invention.

FIG. 3 illustrates the steps to expose target portions (e.g. dies) on a substrate W in the dual stage apparatus of FIG. 1. The process according to conventional practice will be described first.

On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. An important performance parameter of the lithographic process is overlay, which is a measure of how accurately features defined by one patterning step are positioned in relation to features formed on the substrate by previous pattering steps. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid. The step 202 using a novel alignment sensing arrangement AS will be described in more detail below.

At step 204, a map of wafer height (Z) against X-Y position is measured also using the level sensor LS. The height map is used primarily to achieve accurate focusing of the exposed pattern.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment marks formed in a fixed or nominally fixed relationship to the product patterns that are the product of the lithographic process. These alignment data, taken just before exposure, are combined and interpolated to provide parameters of an alignment model. These parameters and the alignment model will be used during the exposure operation to correct positions of patterns applied in the current lithographic step. A conventional alignment model might comprise four, five or six parameters, together defining translation, rotation and scaling of the 'ideal' grid, in different dimensions. As described further in US 2013230797A1, advanced models are known that use more parameters.

At 210, wafers W' and W are swapped, so that the measured substrate W' becomes the substrate W entering the exposure station EXP. In the example apparatus of FIG. 1, this swapping is performed by exchanging the substrate tables WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern. Depending on the implementation, the measurement steps 202, 204 do not have to be performed in that particular order, and can also be performed in parallel.

Alignment Sensing Arrangement

Figure 4:
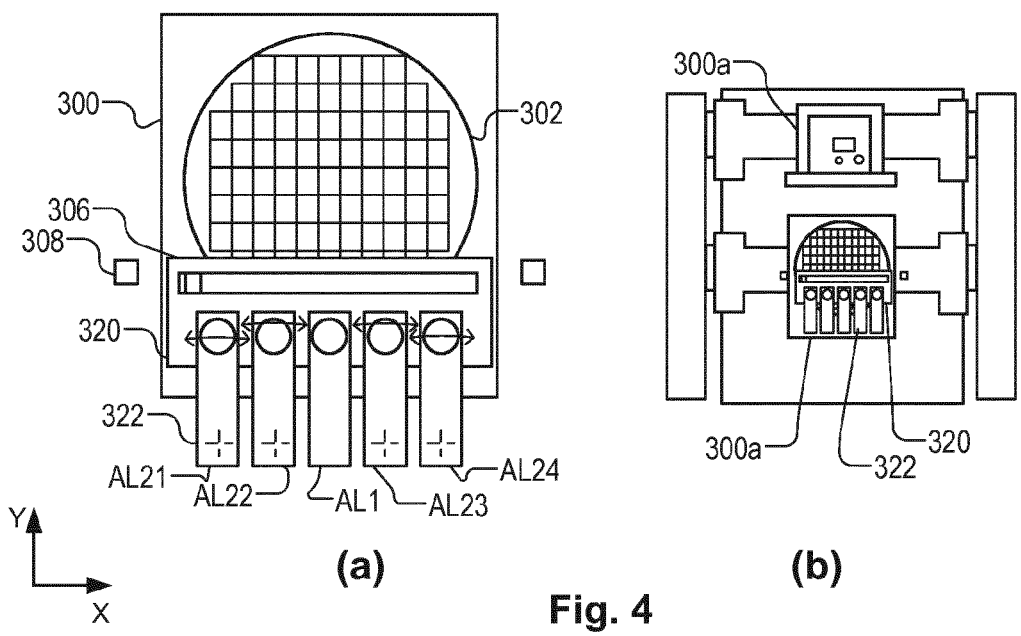
FIG. 4(a) is a schematic plan view of a sensing arrangement in the apparatus of FIG. 1.
FIG. 4(b) is a schematic plan view of measurement and exposure stages in an alternative lithographic apparatus, usable with the sensing arrangement of FIG. 4(a) in another embodiment of the invention.

FIG. 4 shows one example of an alignment sensing arrangement AS used in the lithographic apparatus of FIG. 1. This arrangement incorporates multiple alignment heads AL1 and AL21, AL22, AL23 and AL24. Each alignment head includes an image-based alignment sensor of a type to be described in more detail below. Different numbers and arrangements of alignment heads are possible. The alignment heads are shown generically in FIG. 4 as being positioned over a substrate table 300 which can be for example the substrate table WTa or WTb as shown in previous figures, or other wafer stages for example.

Substrate table 300 is shown as holding a substrate 302 (substrate W' in the example of FIG. 3). In this example, five alignment heads are provided. A central alignment head AL1 forms part of a primary alignment sensor and so is referred to as a "primary alignment head", while the outer alignment heads AL21, AL22, AL23 and AL24 form part of a secondary alignment sensors, and so are referred to as "secondary alignment heads". Also shown in FIG. 4 is a level sensor 306 (LS in FIG. 1) with radiation source 308 and radiation detector 310, which will be described in more detail later.

The alignment heads AL1, AL21, AL22, AL23, AL24 are attached to a reference frame RF (not shown in FIG. 4, for clarity). The manner in which they are used is substantially as described in the prior published applications US2008043212A1 (Shibazaki) and US2011013165A1 (Kaneko). The disclosure of those prior applications is hereby incorporated herein by reference. As in the examples described in the prior patent applications, the reference frame in the present example also caries encoder sensors, not shown in the present FIG. 4. The encoder sensors are all fixedly attached to the projection system PS and are used to track the position of substrate table in X, Y and Z directions. Each encoder sensor is positioned to detect the substrate table position with a diffraction grating provided on the substrate table. The encoders may be used instead of or in conjunction with interferometer sensors, such as the one shown schematically at IF in FIG. 1. In alternative embodiments, encoder sensors may be mounted on the moving substrate table 300, while encoder plates (diffraction gratings or the like) are mounted on the projection system PS or reference frame RF.

As illustrated in FIG. 4(b), an alternative embodiment of lithographic apparatus is also disclosed. This type of apparatus does not have two identical substrate tables 300, but rather a substrate table 300a and a separate measurement table 300b that can be docked with the substrate table. Each of the measurement table and substrate table is provide with its own positioning system, based on linear motors for effecting coarse and fine motion in X and Y directions. This type of arrangement is also described in the prior applications by Shibazaki and Kaneko, and need not be described here in detail. Different arrangements are of course possible.

For the purposes of the following description, the position sensing arrangements can be considered as part of an apparatus as shown in FIGS. 1, 3 and 4(a), or an apparatus as shown in FIG. 4(b).

As in the known lithographic apparatus, each alignment head AL1, AL21, AL22, AL23, AL24 comprises an image-based alignment sensor which is designed to detect an alignment mark, which can be provided on the substrate (P1, P2 in FIG. 1) or on the substrate table; or on a separate measurement stage if applicable. As mentioned already, an alignment mark can be printed in the scribe lanes which run between die areas (target portions C) on the substrate. It is also possible to use as an alignment marker a feature of the product pattern formed on the substrate, or to use specific alignment marks which are printed within the die areas themselves.

It should further be noted that the alignment heads can and probably will be used to measure the positions and/or other characteristics of marks formed on the substrate table 300/300a and/or a measurement table 300b, not only on production substrates. Marks may be provided on calibration plates and the like. Accordingly the term "substrate" in this context is not intended to be limited to the production substrates such as a silicon wafer.

The secondary alignment heads AL21, AL22, AL23, AL24 are moveable in the X direction. These relative movements between the alignment heads allow up to five alignment marks to be measured in parallel, with different spacings. In one embodiment each of the secondary alignment heads AL21, AL22, AL23, AL24 includes an arm 320 that can turn around a rotation center in a predetermined angle range in clockwise and counterclockwise directions (rotation about center 322 is marked on alignment head AL21). The X axis position of the secondary alignment heads AL21, AL22, AL23, AL24 can also be adjusted by a drive mechanism that drives the secondary alignment heads back and forth in the X direction. It is also possible for the secondary alignment heads to be driven in the Y direction. Once the arms of the secondary alignment sensing arrangements are moved to a given location a fixing mechanism is selectively operable to hold the arms in position. The desired positions of the alignment heads for a particular substrate (or batch of substrates) will be specified in the recipe data described above with reference to FIG. 3, along with other parameters of the alignment process. While the alignment sensor illustrated here comprises five alignment heads, of course other numbers of alignment heads could be used, including both odd and even numbers.

An alignment operation using the alignment heads and encoder embodiments is described in detail in the prior applications. Broadly speaking, the substrate table is positioned at different positions, and different subsets of the alignment heads are used to detect alignment marks on the substrate. A number of measurement positions can be defined along the Y-axis with the multiple alignment heads measuring multiple alignment marks at each position. The more positions that are chosen the more accurate the system can be, although the more time consuming the alignment process will be. For example, it is possible to define sixteen alignment marks in successive rows along the X-axis on the substrate comprising three, five, five and three marks respectively which can then be detected by four different alignment positions which make use of three, five, five and three alignment heads respectively. The number of rows of alignment marks can be fewer or more than five, and can even be as high as many hundreds.

The data from the alignment sensors AL1, AL21, AL22, AL23, AL24 can then be used by a computer to compute an array of all the alignment marks on the substrate in a co-ordinate system that is set by the measurement axis of the x and y encoders and the height measurements by performing statistical computations in a known manner using the detection results of the alignment marks and the corresponding measurement values of the encoders, together with a baseline calibration of the primary alignment sensing arrangement and secondary alignment sensing arrangement, which are discussed in more detail in the prior applications. The result of this computation is then used in an alignment model to control patterning steps at the exposure station, as described already with reference to FIG. 3.

Conventional Image-Based Alignment Sensor

Figure 5:
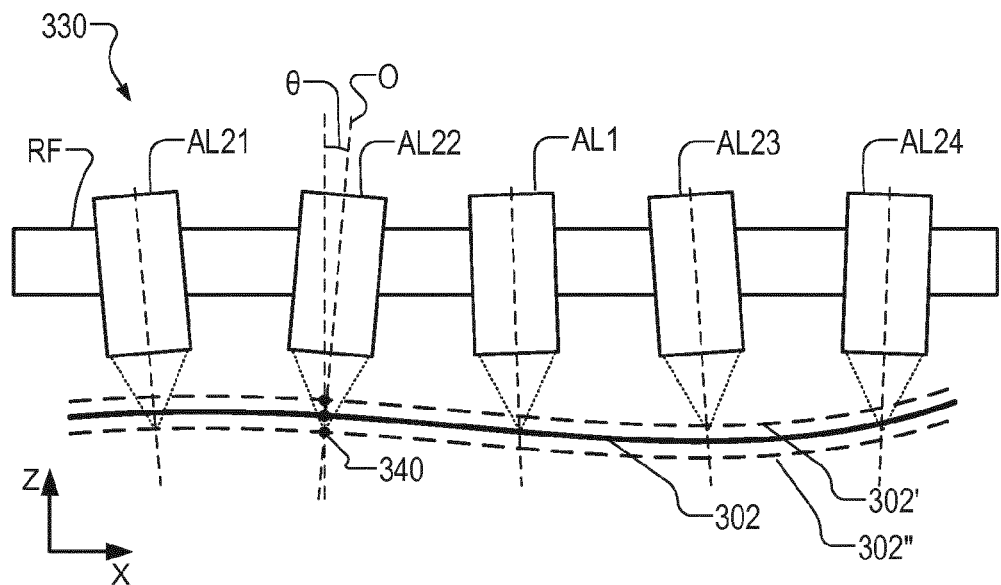
FIG. 5 is a schematic side view of a known sensing arrangement, illustrating problems of defocus and telecentricity.

Referring now to the side view of FIG. 5, we see the five alignment heads AL1, AL21, AL22, AL23, AL24 of the known alignment sensing arrangement 320, mounted on reference frame RF. Although they are nominally all positioned perfectly in X and Y directions, and aligned with their optical axes O parallel to the Z axis, in reality, slight misalignments will exist. For example, sensor AL22 is shown with its optical axis tilted at an angle θ relative to the Z axis (θ may of course represent a tilt about the X and/or Y axes, though only the Y axis tilt is visible in this view). Particularly in an example where the alignment heads are movable, these slight misplacements and tilts may be different from batch to batch. The measurements carried out by multiple alignment heads are carried out simultaneously where possible. However, due to the differing height along the surface of a substrate, a leveling process is typically carried out. This can be performed by moving the substrate table in the Z direction using the positioning system PW in FIG. 1. Alternatives to this will be discussed below. Level sensor LS (elements 306, 308, 310) is provided which uses a focus detection technique to determine when the substrate is in line with a predetermined focal plane of the leveling sensor.

The surface of a substrate 302 is not a flat plane and has some unevenness for example due to manufacturing tolerances, clamping distortion and unevenness introduced by the product features and the processes used to form them. This means in the known apparatus that at least one alignment head generally performs detection of an alignment mark out of focus. FIG. 5 shows an exaggerated example of this, where the middle alignment head AL1 is accurately focused on the substrate surface, but the other heads are out of focus with respect to the uneven substrate 302 surface. There may also be variations in focus height of the individual sensors, even if the substrate were perfectly flat and level.

Figure 6:
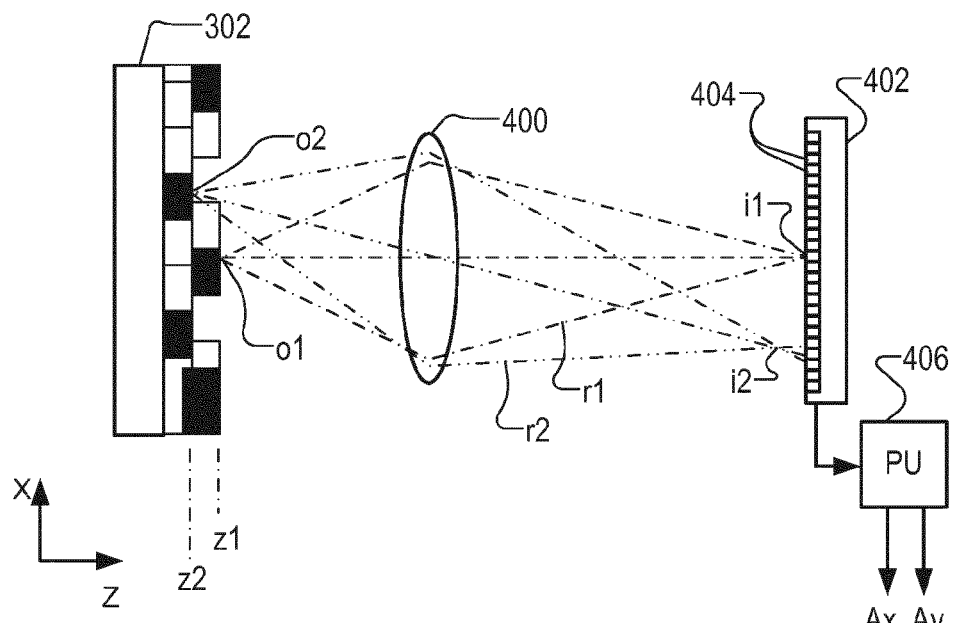
FIG. 6 is a schematic detail of one sensor in the known sensing arrangement of FIG. 5.

FIG. 6 shows in in schematic form the functional elements of one alignment sensor in the known alignment sensor. The sensing arrangement illuminates a subject alignment mark using a broadband detection beam that does not expose the resist layer on a substrate, and picks up an image of the alignment mark using an imaging optical system 400 and an image detector 402. While optical system 400 is represented in the drawing by a simple lens element, the skilled reader will understand that the optical system will be more elaborate in a real implementation, and may include refractive and/or reflective elements. The optical system is shown with the Z axis horizontal, for convenience. The drawing is made in the Z-X plane, but would look similar if drawn in the Z-Y plane. In a practical implementation, there may in fact be folding mirrors so that the optical axis O of the sensor deviates from a vertical to a horizontal path, for example to reduce height of the overall arrangement. Such details are within the ordinary capabilities of the optical system designer and will not be discussed further here.

Image detector 402 comprises a two-dimensional array of photosensitive elements 404 that may conveniently be referred to as pixels. A first object point of lies in a plane with height z1 which happens to coincide with a focal plane of the alignment sensor. Optical system 400 gathers rays r1 from point of and focuses them to an image point i1 which is perfectly in the plane of the pixels 404. If the alignment mark whose position is being measured lies in the plane z1, then a perfectly focused image of the mark is formed on the array of pixels 404. A processing unit 406 receives image data from all the pixels of detector 402 and processes it to recognize the mark and compute its position in the X-Y plane. The results of this computation are shown schematically being delivered as data Ax and Ay. Processing unit 406 may be separate for each sensor, or it may be a central processor of the alignment sensing arrangement, or it may be a function implemented by the lithographic apparatus control unit LACU mentioned above.

As described already with reference to FIG. 5, an alignment mark may not always lie in the focal plane of the sensor. In FIG. 6, a second object point o2 is shown lying in a plane z2 which is (for example) further from the sensor than z1. Rays r2 from this point are not focused in the plane of pixels 404, but somewhat in front of it. Consequently, when an alignment mark lies out of the focal plane z1, the image detected by detector 402 is blurred and processing unit 406 cannot so accurately recognize the mark, or determine its position accurately.

To address this problem in the known apparatus, alignment marks are read with the substrate in several different Z positions, as illustrated at 302' and 302" in FIG. 5. Changing the relative position in the Z-axis of the substrate table allows each of the alignment heads to make a measurement in a focused state, and the prior patent applications describe the procedures and computations that are made to obtain the best position measurement for each mark from among the several measurements made. Additionally, displacement from the ideal focal plane causes the apparent X-Y position to shift. This may be due to non-telecentricity in optical system 400, and/or to the tilt with respect to the Z-axis of the optical axis of each of the alignment heads. Referring to the mark 340 shown in FIG. 5 as an example, the non-zero tilt angle θ means that the apparent X-Y position of the mark changes as the substrate is moved from position 302, to 302' and 302", as well as it becoming out of focus. Calibration measurements can be made for tilt effects, so that the detection results of positions of the alignment marks can be corrected based on the measurement results.

While the known procedures and corrections provide accurate alignment results, each movement in the Z-axis which is performed results in an additional step and increases the overall time for the alignment. Moreover, since different measurements of the same make are taken at different times, accuracy can be degraded by drift due to mechanical and/or thermal effects.

Alignment Sensing Arrangement with Light-Field Imaging

Figure 7:
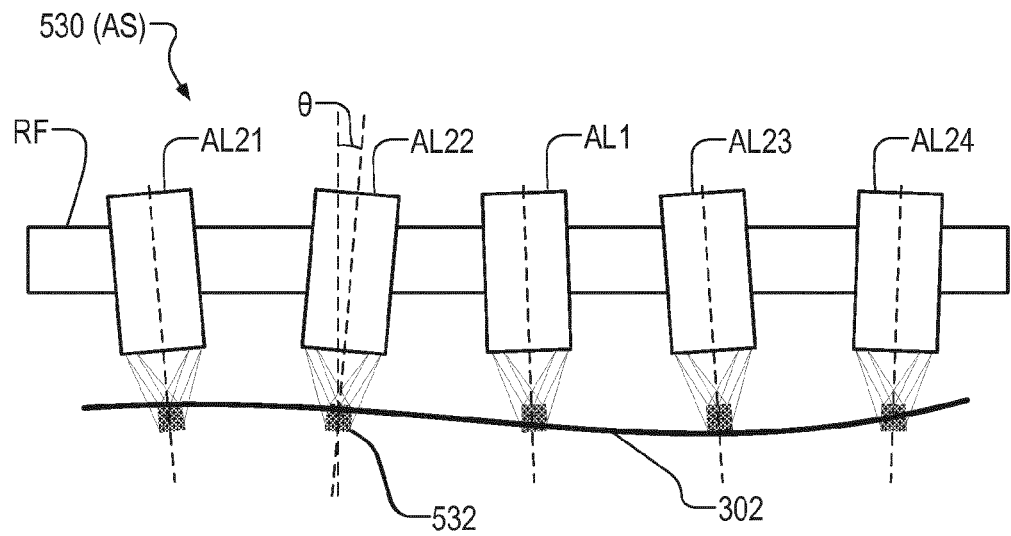
FIG. 7 is a schematic side view of the sensing arrangement in the apparatus of FIGS. 1 to 4, showing the application of light-field imaging.

FIG. 7 illustrates a modified alignment sensing arrangement 530 that forms the alignment sensor AS in the apparatus of FIGS. 1 to 4. The arrangement comprises five alignment heads AL1, AL21, AL22, AL23, AL24, as in the known example. However, the alignment sensor within each alignment head differs from the known sensors in its optical system and data processing. Simply stated, each alignment sensor in the novel arrangement comprises a light-field imaging system (also known as a plenoptic imaging system) rather than a conventional 2-D imaging system. As illustrated schematically in FIG. 5, each light-field image sensor can image marks within an extended zone 532, rather than a single focal plane. The method described in this invention disclosure has the aim to reduce the number of images of each mark that need to be taken during the alignment step. Potentially, a single exposure will be sufficient to obtain focused images of all marks. So-called 4-D light-field information is captured by detector 602, and focusing and other adjustments can be performed digitally within processing unit 606. This means alignment duration and drift can be reduced. Alternatively or in addition, the light-field images can be processed to correct for tilt and telecentricity. Further they can be used to perform or assist height measurement (level sensor).

Figure 8:
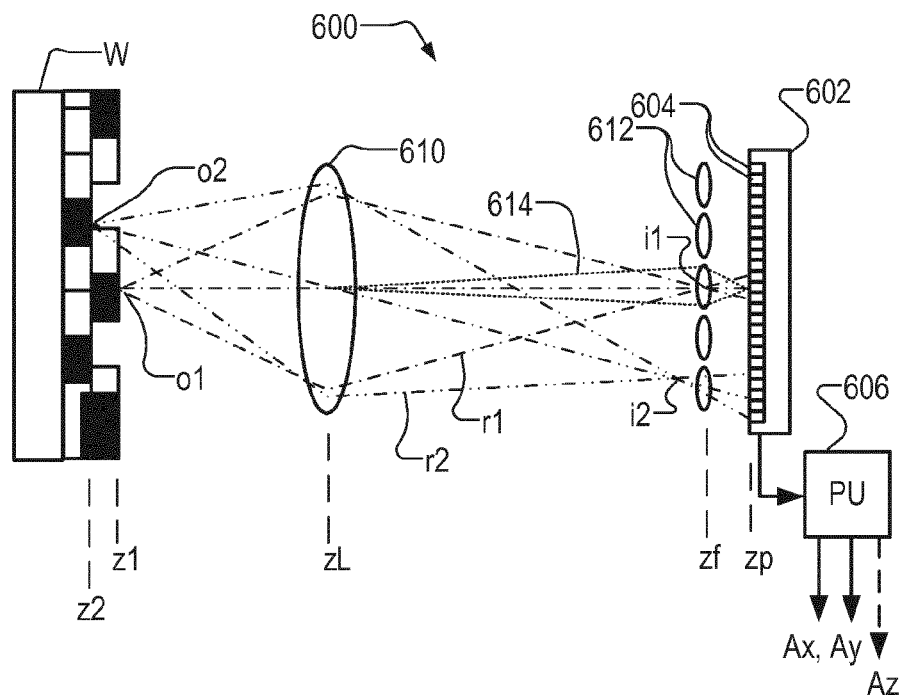
FIG. 8 is a schematic detail of one sensor in the sensing arrangement of FIG. 6, showing one implementation of light-field imaging.

FIG. 8 shows the modified optical system 600 and processing unit 606 of one sensor in the arrangement of FIGS. 4 and 7, in a first example. A primary optical system 610 is provided which for ease of understanding can be considered identical to the "normal" optical system 400 in the known sensor. In the modified optical system 600, the image detector 602 with pixels 604 is not placed in a focal plane of the primary optical system. An array of microlenses 612 is placed in a nominal focal plane zf of optical system 610 (where the image detector was in the conventional sensor). Each microlens 612 corresponds in area to a sub-array of the pixels 604. The microlenses are arrayed in two dimensions and may be far smaller and more numerous than the few illustrated in the drawings. Similarly, the pixels of image detector are far more numerous than illustrated. The array of microlens is an example of a light field modulating element. Other forms of light field modulating elements are known for light-field imaging in other fields of application, as described below.

As illustrated by rays 614, in this example, the power of each microlens 612 is such as to focus a point in a pupil plane zL of optical system 610 onto a point in the plane zp of the pixels 604. Consequently, while the image detected by detector 602 may be similar to the conventional 2D image on a large scale, the intensity when one looks at individual pixels depends not only on the relative brightness of object points such as points o1 and o2, but also on the angle of rays r1 and r2 falling at each point on the microlens array. By combining image data from pixels selected for their positions in relation to the microlenses, not only the image i1 but also the image i2 can be focused digitally and objects o1 and o2 can both resolved in a digital image. Consequently, when each of the alignment heads AL1, AL21, AL22, AL23, AL24 in FIG. 7 has a sensor of the type illustrated, then five alignment marks can be focused digitally using information of a single exposure. Even if the range of this "digital focusing" is not sufficient for the large height variations across a particular substrate, the number of images required at different Z-positions would be reduced.

This light-field imaging technique (based on plenoptic imaging) has been applied in microscopy to allow "3D-studies" of biological specimens. In alignment sensors for photolithography, the use of light-field imaging has not been reported. Only a 2-D image is captured at the sensor plane. More detail of light-field microscopy can be found in the paper Levoy et al, "Light Field Microscopy", ACM Transactions on Graphics 25(3), Proc. SIGGRAPH 2006 and on the Stanford University website at http://graphics.stanford.edu/papers/lfmicroscope/. A published patent application WO 2007/044725 describes substantially the same work. As explained by Levoy et al, each micro-lens measures not just the total amount of light deposited at that location, but how much light arrives along each ray (angular direction). By re-sorting the measured rays of light to where they would have terminated in traditional camera systems, sharp images can be computed with different depths-of-focus. Thus, the final field image of the alignment mark becomes a computational composition of weighted pixel-subsets. Different focal depths can be selected by means of choosing different spatial pixel configurations (from single or multiple pixel subsets) to focus on the alignment mark with the optimal height. Thus, a specific pixel subset corresponds to a certain focus height. The subset configuration can be stored in a look-up table after calibration. This property allows extending the depth-of-field of the image sensor without reducing the aperture and enabling single exposure field image alignment, without adjusting the height of the substrate table itself.

Additionally, Levoy et al describe how selecting further different subsets of pixels allows a shift of viewpoint to be achieved in the X-Y plane, as well as a shift of focus. This can be used to correct tilt and telecentricity effects, so that the position of an alignment mark or other target features in the computed image is independent of depth.

Figure 9:
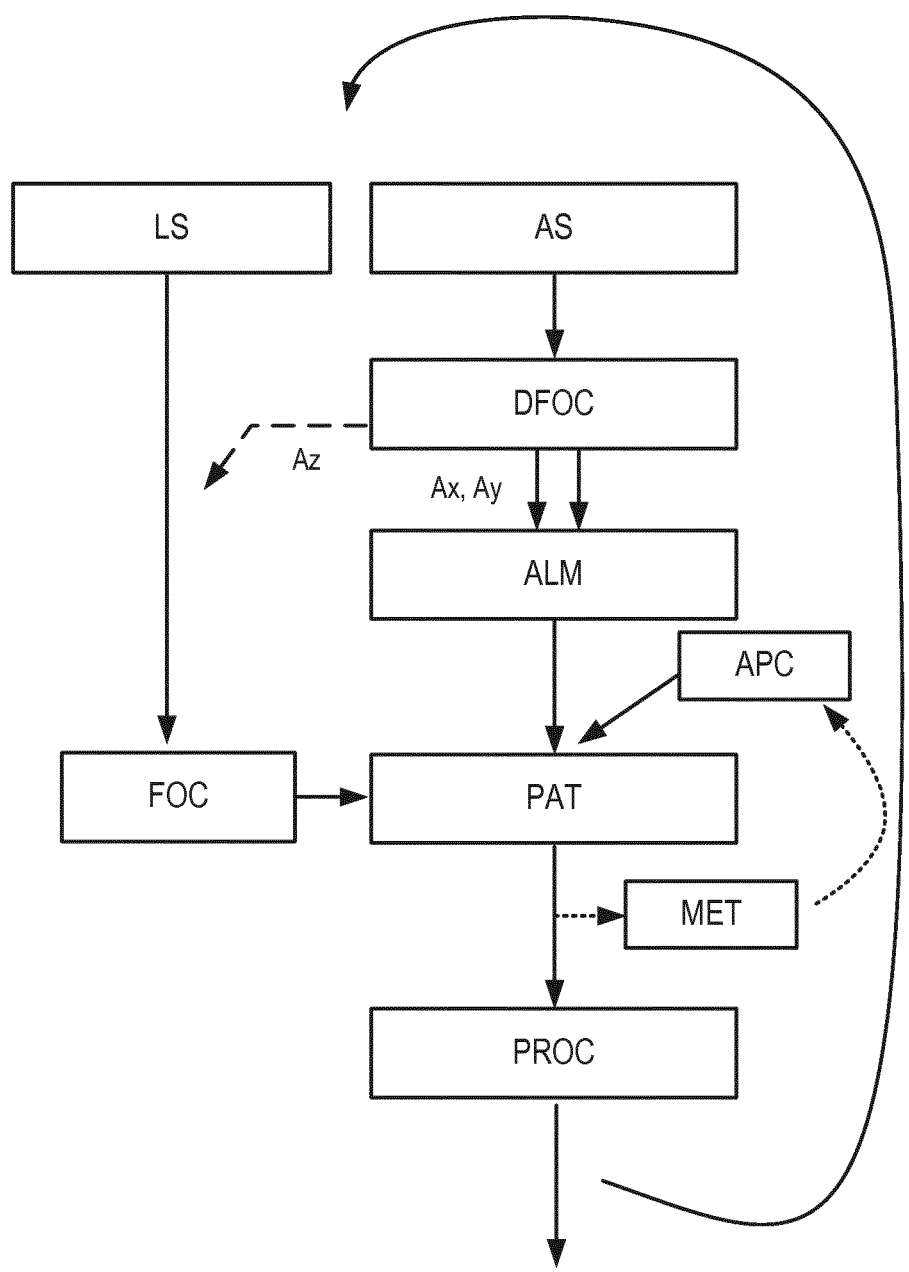
FIG. 9 is a flowchart of part of a device manufacturing method using the apparatus of FIG. 1.

FIG. 9 is a simplified flowchart summarizing part of a device manufacturing method exploiting the novel alignment sensing arrangement as described above in one exemplary embodiment. This diagram can be read in conjunction with FIG. 3. Substrates are loaded in to the lithographic apparatus measured using alignment sensor arrangement AS and level sensor LS. In the dual-stage example of FIG. 1, step PAT is performed at measurement station MEA. Using the 4-D light-field image data collected by the sensors in each alignment head, alignment positions Ax and Ay for numerous marks are calculated in a digital focusing step DFOC.

A benefit of light-field imaging is that an alignment mark can be brought into focus by each alignment head, even though physically they are at different distances from the sensor. Another benefit is that depth information Az can be obtained which allows processing unit 606 to correct displacements in the apparent X-Y position of a mark based knowledge of the telecentricity and/or tilt angle of the individual alignment heads. Tilt and telecentricity can be measured in a calibration sequence, in which substrate 302 is measured at different heights, as shown in FIG. 5.

An alignment model ALM based on the alignment data is used to control the positioning of an applied pattern in the patterning step PAT. In the dual-stage example of FIG. 1, step PAT is performed at exposure station EXP. The height map data from the level sensor LS is used in a focus control model FOC to control focus in the patterning step. After the pattern is applied to each target portion in patterning step PAT, the substrate is processed to create device features in accordance with the pattern. The substrate returns for further patterning until all product layers are complete. Additionally, an advanced process control module APC can use metrology data from an inspection apparatus MET such as a scatterometer, to update control of the process.

The method described above, enables field image alignment by means of a single exposure. Reducing the number of image required during the alignment process is beneficial for throughput and overlay. Throughput is improved simply because less measurement time per mark is required. Overlay performance is improved because alignment of each layer is less affected by drift between multiple images required for alignment measurements in the known arrangements.

In addition to correcting focus and telecentricity, other aberrations of optical system 610 can be corrected by digital processing. Spherical aberrations for example are digitally correctable in a similar way as refocusing.

Further, multiple focus planes can be selected simultaneously, within the same alignment sensor. Therefore underlying structures can be set to focus at the same time. This can be used for example to measure overlay between marks formed in two layers on the substrate.

The example light-field imaging sensors illustrated in FIG. 8 are based on microlenses as the simplest implementation of the light-field imaging concept. However, other implementations of light-field imaging are known, for example those based on coded masks. Coded masks may be regarded as an example of spatial light modulators (SLMs). Known examples comprise arrays of square elements which are either opaque or transparent, according to a predefined pattern. Knowledge of the pattern can be used to reconstruct different images from a recorded light field, in the same way as knowledge of the microlens array can be used in the example of FIG. 8. As is known, programmable SLMs can be implemented by transmissive elements (for example, liquid crystal SLM) and/or reflective (for example, deformable micromirror device). In general terms, the microlens array, coded masks, SLMs can be regarded as examples of light field modulating elements. Different implementations bring different combinations of imaging performance parameters such as spatial resolution, noise sensitivity, light usage and so forth. In particular, while a simple microlens implementation generally leads to a loss of spatial resolution that may be undesirable in the alignment sensor application, mask-based imaging offers full resolution. Coded mask may be placed at various locations in the optical path, for example in place of the illustrated microlens array, in superposition with a microlens array, and/or in the pupil plane of the primary optical system 610. Coded masks and/or microlens arrays may be placed in an illumination light path, as well as an imaging light path.

The following publications provide theoretical and experimental teachings in relation to light-field imaging, primarily in the field of photography.

K. Marwah, G. Wetzstein, Y. Bando, R. Raskar, "Compressive Light Field Photography using Overcomplete Dictionaries and Optimized Projections", Proc. of SIGGRAPH 2013 (ACM Transactions on Graphics 32, 4), 2013.

A. Ashok, Mark A. Neifeld, "Compressive light-field imaging", SPIE Newsroom, DOI: 10.11117/2.1201008.003113, 19 Aug. 2010.

O. Cossairt, M. Gupta, Shree K Nayar, "When Does Computational Imaging Improve Performance?", IEEE Transactions on Image Processing (Volume 22, Issue 2), February 2013, Pages 447-458, DOI: 10.1109/TIP.2012.2216538.

I. Ihrke, G. Wetzstein, W. Heidrich, "A theory of plenoptic multiplexing", 2010 IEEE Computer Society Conference on Computer Vision and Pattern Recognition, pp 483-490, 13-18 Jun. 2010, San Francisco, Calif., http://doi.ieeecomputersociety.org/10.1109/CVPR.2010.5540174.

T. E. Bishop, S. Zanetti, P. Favaro, "Light Field Super-resolution", in 1st IEEE International Conference on Computational Photography (ICCP), April 2009, Pages 1-9, DOI: 10.1109/ICCPHOT.2009.5559010.

Z. Xu, J. Ke, E. Y Lam, "High-resolution lightfield photography using two masks", Optics Express. May 2012 7; 20(10):10971-83. DOI: 10.1364/OE.20.010971.

M. W. Tao, S. Hadap, J. Malik, and R. Ramamoorthi, "Depth from Combining Defocus and Correspondence Using Light-Field Cameras". Proceedings of International Conference on Computer Vision (ICCV), 2013.

The skilled reader can adapt these teachings to the sensing and control arrangements for alignment and/or focusing in a lithographic apparatus, or similar measurement and control functions in other apparatuses. In particular, these teachings enable the skilled reader to select a combination of optical system and processing techniques that provide a desired trade-off between light levels, spatial resolution and the like.

Figure 10:
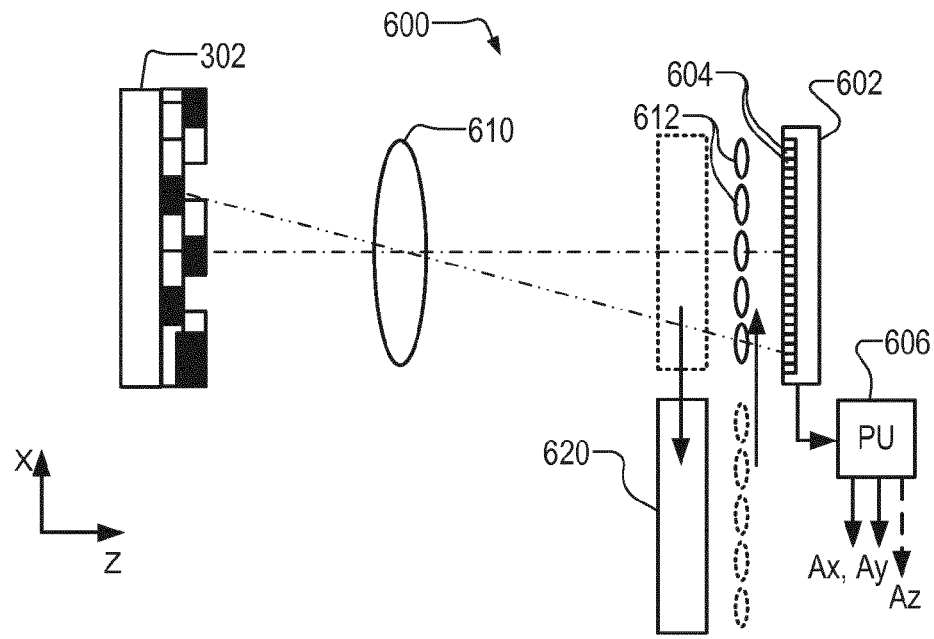
FIG. 10 is a schematic detail of a modified sensor operable in a normal mode and a light-field mode.

FIG. 10 shows a modified version of the light-field image sensor optical system 600 of FIG. 8, adapted to allow either light-field imaging for digital focusing or conventional imaging to be performed by the alignment sensing arrangement. Elements are the same as in FIG. 8, except that the array of microlenses 612 is moveable out of the optical path. A path length correction element 620 is swapped into the optical path, so as to focus the primary optical system 610 onto the pixels 604 instead of the (absent) microlens array. Alternatively, image detector 602 could be moved forward or backward to achieve the same effect. As already mentioned, light-field imaging can involve a compromise between different performance parameters. For example, the ability to refocus digitally from a single exposure might be gained at the expense of reduce performance in light capture, or spatial resolution.

Being able to select light-field imaging or conventional 2-D imaging allows the operator to choose whether to exploit the benefits of the novel light-field image sensors or to exploit the benefits of the conventional imaging system. Another option is to use both types of imaging on the same substrate, for example to calibrate the light-field imaging function against the conventional imaging function. Selection of the mode to use and calibration can be automated. In addition to selecting between light-field and non-light-field imaging modes, the sensors can be switched between different modes of light-field imaging, for example using different techniques from among those described in the references cited above.

Figure 11:
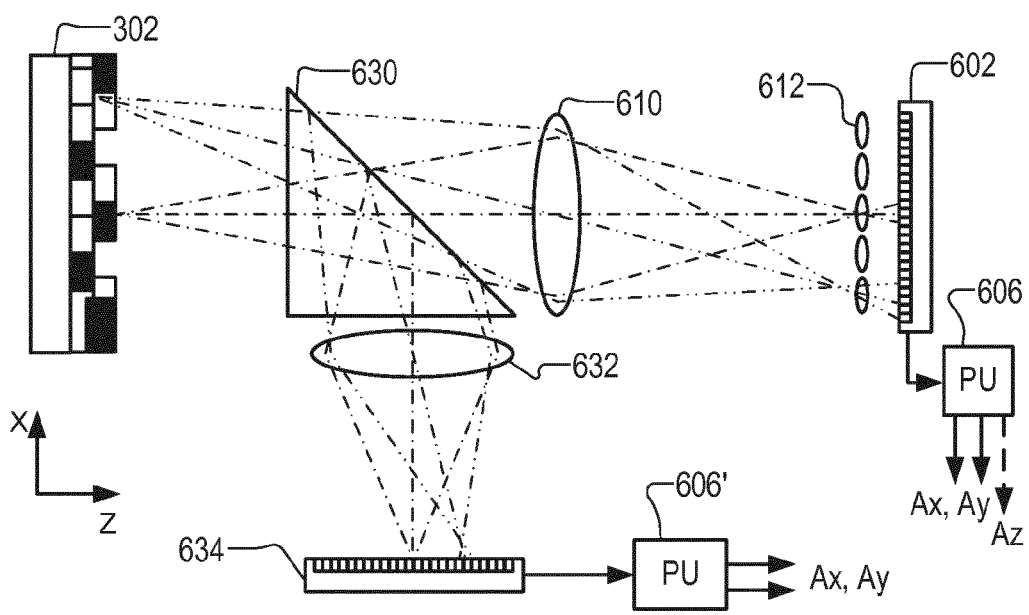
FIG. 11 is a schematic detail of another modified sensor operable in normal and light-field modes.

FIG. 11 illustrates another modification of the light-field image sensor optical system 600 in which separate branches are provided in the optical system for light-field imaging and conventional 2-D imaging. A beam diverting element 630 diverts rays away from the light-field imaging path to a second optical system 632 and second image detector 634. A second processing unit 606' is indicated, which processes image data from the detector 634, although units 606 and 606' can of course be two functions of a single physical processing unit. Beam diverting element may be for example a movable mirror or prism, by which an operator can select whether to use light-field imaging or conventional imaging. Beam diverting element may on the other hand be a beam splitter such that light from the alignment mark is processed by both the light-field imaging branch and the conventional imaging branch at the same time. Results of processing unit 606 may for example tell which of the marks imaged by conventional imaging branch are in focus.

Height Sensing by Light-Field Imaging

As shown in a broken line in FIG. 8, the digital processing at step DFOC can also produce height data Az to supplement or potentially replace that provided by level sensors LS. That is to say, by recognizing the depth of best focus for each image of each alignment mark, or for other features on the substrate, a height value for that mark can be derived, in addition to an X-Y position. In principle, the light-field image sensors could be used entirely for height sensing to control focus in the patterning step, but their primary function in the present example is alignment to control X-Y position in the patterning step.

Figure 12:
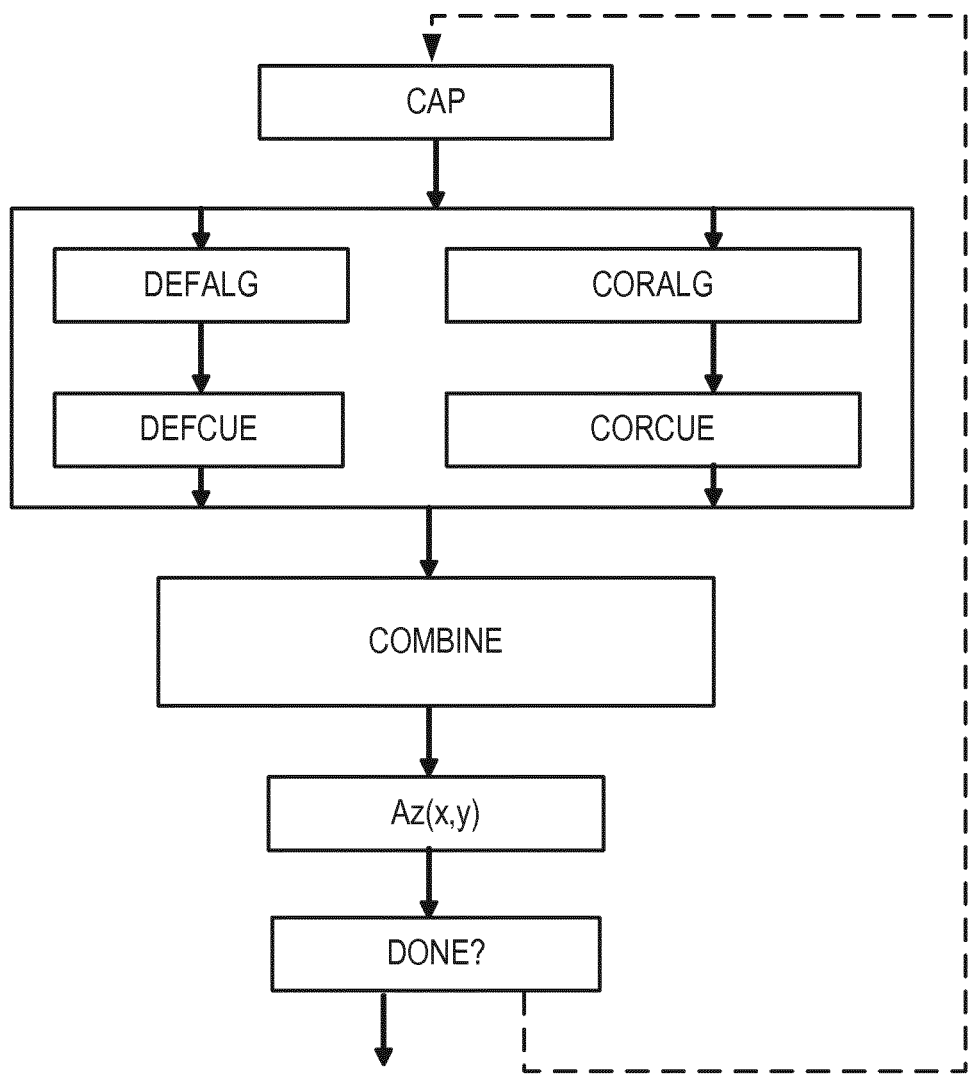
FIG. 12 is a flowchart of a height sensing method using a light-field imaging sensor.

FIG. 12 is a more detailed flowchart showing the extraction of depth information for one mark in one light-field imaging sensor of the type shown in FIGS. 7 and 8. The method is based on that of the Tao et al paper, referenced above. A light-field image is captured in a step CAP, using the optical system 610 and image detector 602. Two types of depth analysis are then performed on the light-field image data, and their results combined. A defocus algorithm DEFALG calculates defocus cues DEFCUE and a correspondence algorithm CORALG calculates correspondence cues CORCUE. These different types of cues are then combined to obtain a depth value, for example the value Az referred to in earlier description. As described by Tau, an algorithm that exploits both types of analysis is more robust than either analysis alone. This method is repeated to calculate depth values for every position in the image. As indicated by the broken path, flow returns to capture new images until all positions have been measured. The flow may return to capture a new image at the same position if the quality of captured data is deemed not sufficient. The flow may return to capture a new image at the same position if the depth of focus in the light-field image data is not great enough to cover all possible depths of focus in a single light-field image.

The proposed use of light-field imaging is not limited to the 2D alignment purpose, but can also be exploited in a more general 3D metrology application. That is, depth or height information can be extracted from the light-field image, since both defocus and correspondence depth cues are available simultaneously in one capture. Height maps in lithography are typically based on fringe projection and interferometry, which are recorded separately from, or in parallel with, alignment measurements. As is mentioned above, refocused images can be constructed after acquisition of images captured using a lens let array or other light field modulating element(s), as well as obtaining multiple views by shifting digitally viewpoint within the aperture of the main objective lens, for example to compensate telecentricity. Combining both defocus and correspondence cues of a single exposure, height maps of desired features can be computed.

The skilled person can readily adapt the depth camera techniques of Tau et al to perform a height mapping function in the lithographic apparatus of FIGS. 1 to 4. The light-field image sensor(s) used for this may be dedicated depth sensor(s), or it/they may be the same as the alignment sensors used for X-Y position measurement. The depth sensors may be used instead of or as a supplement to the optical level sensor LS conventionally used in lithography, as already mentioned.

CONCLUSIONS

In conclusion, the novel method, for obtaining measurement s to control a patterning process in lithography can reduce measurement time and so help maintain a high throughput of products.

An embodiment of the invention may be implemented using a computer program containing one or more sequences of machine-readable instructions describing a methods of controlling the lithographic apparatus using alignment and/or height map data obtained by light-field imaging as described above. This computer program may be executed for example within the control unit LACU of FIG. 2, or some other controller. There may also be provided a data storage medium (e.g., semiconductor memory, magnetic or optical disk) having such a computer program stored therein. Where an existing lithographic apparatus, for example of the type shown in FIG. 1, is already in production and/or in use, the invention can be implemented by the provision of updated computer program products for causing a processor to perform the modified image processing step DFOC of a method shown in FIG. 9 and/or the steps of FIG. 12.

Although specific reference may have been made above to the use of embodiments of the invention in the context of optical lithography, it will be appreciated that the invention may be used in other applications, for example imprint lithography, and where the context allows, is not limited to optical lithography. In imprint lithography, topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Digital refocusing for field image alignment is explained above with reference to lithographic apparatus, i.e., an apparatus for exposing a substrate to a patterned beam of radiation, the substrate being covered with a photo-sensitive resist. For completeness, it is remarked here that such digital refocusing can also be applied in metrology apparatus for, e.g., diffraction based overlay (DBO) and diffraction based focus (DBF) analysis. A metrology apparatus subjects an exposed substrate to operations for analyzing the quality of the result of the exposure in terms of, e.g., overlay and/or focus. A system with two or more cameras can be applied with each individual detection branch (completely separated or with a main optical path as common detection branch) for optimal performance for feature to be detected. As a result, information about polarization, pupil plane and field can be extracted. The benefits of the invention applied to the metrology tool are similar to the benefits of application of the invention in a lithographic apparatus: image focus correction is done by software. The image can then be refocused without moving objective or moving other parts, resulting eventually in an increase in throughput. Focus errors, introduced by hardware, can also be reduced.

In an embodiment, there is provided a lithographic apparatus for applying a pattern onto a substrate, the apparatus including: at least one sensor for measuring positions of features on the substrate prior to applying the pattern, the sensor comprising an imaging optical system, and an image detector for capturing an image formed by the imaging optical system; a data processor for extracting position measurements from pixel data supplied by the image detector; and a controller arranged to control the lithographic apparatus to apply the pattern to the substrate using the positions measured by the sensor, wherein the imaging optical system includes one or more light field modulating elements and the data processor is arranged to process the pixel data as a light-field image to extract the position measurements.

In an embodiment, the data processor is arranged to derive from the light-field image a focused image of a feature on the substrate, and to indicate a position of the feature based on the focused image in directions transverse to an optical axis of the imaging optical system. In an embodiment, the data processor is arranged to include in the position measurement a correction to reduce a depth dependency of an apparent position of the feature in the detected image. In an embodiment, the data processor is arranged to derive from the light-field image an image of a feature on the substrate with a viewpoint corrected. In an embodiment, the data processor is arranged to derive from the light-field image a measurement of height of a feature on the substrate, the dimension of height being substantially parallel to an optical axis of the imaging optical system, the controller using the measurement of height to control focusing of a pattern applied by the lithographic apparatus. In an embodiment, the data processor is arranged to derive from the light-field image an image focused at two or more depths. In an embodiment, the sensor is one of a plurality of similar sensors mounted on a common reference frame, the plurality of sensors in operation measuring positions of a plurality of features substantially simultaneously at respective locations across the substrate, the processor of each sensor deriving from its respective light-field image an image focused on a local portion of the substrate. In an embodiment, the sensor is one of a plurality of similar sensors mounted on a common reference frame, the plurality of sensors in operation measuring positions of a plurality of features substantially simultaneously at respective locations across the substrate, the processor of each sensor deriving from its respective light-field image an image adjusted for a sensor-specific dependency between position and depth.

In an embodiment, there is provided a device manufacturing method comprising applying patterns in successive layers on a substrate, and processing the substrate to produce functional device features, wherein the step of applying a pattern in at least one of the layers comprises: (a) measuring positions of features on the substrate in a lithographic apparatus, using at least one light-field imaging sensor; (b) extracting position measurements from light-field image data obtained using the sensor; and (c) controlling the lithographic apparatus to apply the pattern to the substrate using the positions measured by the alignment sensor.

In an embodiment, step (b) comprises deriving from the light-field image data a focused image of a feature on the substrate and indicates a position of the feature based on the focused image in directions transverse to an optical axis of the imaging optical system. In an embodiment, the position measurement includes a correction to reduce a depth dependency of an apparent position of the feature in the detected image. In an embodiment, step (b) comprises deriving from the light-field image an image of a feature on the substrate with a viewpoint corrected. In an embodiment, step (b) comprises deriving from the light-field image a measurement of height of a feature on the substrate, the dimension of height being substantially parallel to an optical axis of the imaging optical system, and step (c) comprises using the measurement of height to control focusing of a pattern applied by the lithographic apparatus. In an embodiment, step (b) comprises deriving from the light-field image an image focused at two or more depths. In an embodiment, the sensor is one of a plurality of similar sensors mounted on a common reference frame, the plurality of sensors measuring positions of a plurality of features substantially simultaneously at respective locations across the substrate, and step (b) comprises deriving from its respective light-field image an image focused on a local portion of the substrate. In an embodiment, the sensor is one of a plurality of similar sensors mounted on a common reference frame, the plurality of sensors measuring positions of a plurality of features substantially simultaneously at respective locations across the substrate, and step (b) comprises for each sensor deriving from its respective light-field image an image adjusted for a sensor-specific dependency between position and depth.

In an embodiment, there is provided a computer program product comprising machine-readable instructions for causing one or more processors to implement the data processor and controller functions of a lithographic apparatus as described herein.

In an embodiment, there is provided a data processing system comprising one or more processors programmed to implement the controller of a lithographic apparatus as described herein.

In an embodiment, there is provided a computer program product comprising machine-readable instructions for causing one or more processors to perform the step (b) of the method as described above.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A lithographic apparatus for applying a pattern onto a substrate, the lithographic apparatus including:
    at least one sensor configured to measure positions of features on the substrate prior to applying the pattern, the at least one sensor comprising an imaging optical system, and an image detector for capturing an image formed by the imaging optical system;
    a data processor configured to extract position measurements from pixel data supplied by the image detector; and
    a controller arranged to control the lithographic apparatus to apply the pattern to the substrate using the positions measured by the at least one sensor,
    wherein the imaging optical system includes one or more light field modulating elements and the data processor is arranged to process the pixel data as a light-field image to extract the position measurements.

2. The apparatus as claimed in claim 1, wherein the data processor is arranged to derive from the light-field image a focused image of a feature on the substrate, and to indicate a position of the feature based on the focused image in a direction transverse to an optical axis of the imaging optical system.

3. The apparatus as claimed in claim 2, wherein the data processor is arranged to include in the position measurement a correction to reduce a depth dependency of an apparent position of the feature in the detected image.

4. The apparatus as claimed in claim 1, wherein the data processor is arranged to derive from the light-field image an image of a feature on the substrate with a viewpoint corrected.

5. The apparatus as claimed in claim 1, wherein the data processor is arranged to derive from the light-field image a measurement of height of a feature on the substrate, the dimension of height being substantially parallel to an optical axis of the imaging optical system, the controller using the measurement of height to control focusing of a pattern applied by the lithographic apparatus.

6. The apparatus as claimed in claim 1, wherein the data processor is arranged to derive from the light-field image an image focused at two or more depths.

7. The apparatus as claimed in claim 1, wherein the at least one sensor is one of a plurality of similar sensors mounted on a common reference frame, the plurality of sensors in operation measuring positions of a plurality of features substantially simultaneously at respective locations across the substrate, the processor of each sensor deriving from its respective light-field image an image focused on a local portion of the substrate.

8. The apparatus as claimed in claim 1, wherein the at least one sensor is one of a plurality of similar sensors mounted on a common reference frame, the plurality of sensors in operation measuring positions of a plurality of features substantially simultaneously at respective locations across the substrate, the processor of each sensor deriving from its respective light-field image an image adjusted for a sensor-specific dependency between position and depth.

9. A device manufacturing method comprising applying patterns in successive layers on a substrate, and processing the substrate to produce functional device features, wherein applying at least one of the patterns in at least one of the layers comprises:
   measuring positions of features on the substrate in a lithographic apparatus, using at least one light-field imaging sensor;
   extracting position measurements from light-field image data obtained using the at least one light-field imaging sensor; and
   controlling the lithographic apparatus to apply the at least one pattern to the substrate using the position measurements.

10. The method as claimed in claim 9, wherein the extracting comprises deriving from the light-field image data a focused image of a feature on the substrate and indicating a position of the feature based on the focused image in a direction transverse to an optical axis of the imaging optical system.

11. The method as claimed in claim 10, wherein the position measurement includes a correction to reduce a depth dependency of an apparent position of the feature in the detected image.

12. The method as claimed in claim 9, wherein the extracting comprises deriving from the light-field image data an image of a feature on the substrate with a viewpoint corrected.

13. The method as claimed in claim 9, wherein the extracting comprises deriving from the light-field image data a measurement of height of a feature on the substrate, the dimension of height being substantially parallel to an optical axis of the imaging optical system, and the controlling comprises using the measurement of height to control focusing of a pattern applied by the lithographic apparatus.

14. The method as claimed in claim 9, wherein the extracting comprises deriving from the light-field image data an image focused at two or more depths.

15. The method as claimed in claim 9, wherein the at least one light-field imaging sensor is one of a plurality of similar sensors mounted on a common reference frame, the plurality of sensors measuring positions of a plurality of features substantially simultaneously at respective locations across the substrate, and the extracting comprises deriving from its respective light-field image data an image focused on a local portion of the substrate.

16. The method as claimed in claim 9, wherein the at least one light-field imaging sensor is one of a plurality of similar sensors mounted on a common reference frame, the plurality of sensors measuring positions of a plurality of features substantially simultaneously at respective locations across the substrate, and the extracting comprises for each sensor deriving from its respective light-field image data an image adjusted for a sensor-specific dependency between position and depth.

17. A non-transitory computer program product comprising machine-readable instructions configured to cause a processor system to at least:
   process pixel data as a light-field image to extract position measurements of features on a substrate in a lithographic apparatus, the pixel data obtained by an image detector capturing an image of the substrate formed by an imaging optical system including one or more light field modulating elements; and
   control the lithographic apparatus to apply a pattern to the substrate using the position measurements.

18. A data processing system comprising one or more processors programmed to implement a controller of a lithographic apparatus, the one or more processors configured to at least:
   process pixel data as a light-field image to extract position measurements of features on a substrate in the lithographic apparatus, the pixel data obtained by an image detector capturing an image of the substrate formed by an imaging optical system including one or more light field modulating elements; and
   control the lithographic apparatus to apply a pattern to the substrate using the position measurements.

19. A non-transitory computer program product comprising machine-readable instructions configured to cause one or more processors to extract position measurements from light-field image data obtained using at least one light-field imaging sensor measuring features on a substrate in a lithographic apparatus.

20. The computer program product of claim 19, wherein the instructions are further configured to control the lithographic apparatus to apply a pattern to the substrate using the position measurements.

* * * * *